(12) United States Patent
Naito et al.

(10) Patent No.: US 12,308,249 B2
(45) Date of Patent: May 20, 2025

(54) ETCHING LIQUID FOR TITANIUM AND/OR TITANIUM ALLOY, METHOD FOR ETCHING TITANIUM AND/OR TITANIUM ALLOY WITH USE OF SAID ETCHING LIQUID, AND METHOD FOR PRODUCING SUBSTRATE WITH USE OF SAID ETCHING LIQUID

(71) Applicants: MITSUBISHI GAS CHEMICAL COMPANY, INC., Chiyoda-ku (JP); Mitsubishi Gas Chemical Trading, Inc., Chiyoda-ku (JP)

(72) Inventors: Yukihide Naito, Tokyo (JP); Hiroshi Matsunaga, Kanagawa (JP); Satoshi Tamai, Kanagawa (JP)

(73) Assignees: MITSUBISHI GAS CHEMICAL COMPANY, INC., Chiyoda-ku (JP); Mitsubishi Gas Chemical Trading, Inc., Chiyoda-ku (JP)

( * ) Notice: Subject to any disclaimer, the term of this patent is extended or adjusted under 35 U.S.C. 154(b) by 45 days.

(21) Appl. No.: 17/996,170

(22) PCT Filed: Apr. 7, 2021

(86) PCT No.: PCT/JP2021/014689
§ 371 (c)(1),
(2) Date: Oct. 13, 2022

(87) PCT Pub. No.: WO2021/210458
PCT Pub. Date: Oct. 21, 2021

(65) Prior Publication Data
US 2023/0238251 A1   Jul. 27, 2023

(30) Foreign Application Priority Data

Apr. 14, 2020 (JP) ................ 2020-072498

(51) Int. Cl.
*H01L 21/3213* (2006.01)

(52) U.S. Cl.
CPC ............... *H01L 21/32134* (2013.01)

(58) Field of Classification Search
None
See application file for complete search history.

(56) References Cited

U.S. PATENT DOCUMENTS

| 4,554,050 A | 11/1985 | Minford et al. |
| 5,462,638 A | 10/1995 | Datta et al. |

(Continued)

FOREIGN PATENT DOCUMENTS

| JP | 08-01 3166 A | 1/1996 |
| JP | 08-053781 A | 2/1996 |

(Continued)

OTHER PUBLICATIONS

International Search Report issued Jun. 29, 2021 in PCT/JP2021/014689 filed Apr. 7, 2021, 2 pages.

*Primary Examiner* — Allan W. Olsen
(74) *Attorney, Agent, or Firm* — Oblon, McClelland, Maier & Neustadt, L.L.P.

(57) ABSTRACT

An etching method for quickly removing a seed layer that is formed of titanium and/or a titanium alloy, while suppressing dissolution of other metals from copper wiring lines and the like, for continuous and stable processing; and a composition which is used for this etching method. The composition comprises, based on a total amount of the composition, 0.01 to 0.23% by mass hydrogen peroxide, 0.2 to 3% by mass fluoride, 0.0005 to 0.025% by mass of a halide ion other than a fluoride ion, and water. A method for using the composition to produce a substrate is also described.

9 Claims, 1 Drawing Sheet

(56) References Cited

U.S. PATENT DOCUMENTS

| | | | |
|---|---|---|---|
| 2002/0077259 A1* | 6/2002 | Skee | C11D 7/265 |
| | | | 134/28 |
| 2006/0278307 A1* | 12/2006 | Nitschke | C23C 22/73 |
| | | | 148/260 |
| 2007/0060490 A1* | 3/2007 | Skee | C11D 7/32 |
| | | | 510/175 |
| 2009/0212021 A1 | 8/2009 | Bernhard et al. | |
| 2016/0130500 A1* | 5/2016 | Chen | C11D 7/06 |
| | | | 216/13 |
| 2016/0177457 A1 | 6/2016 | Yokomizo et al. | |
| 2018/0237923 A1* | 8/2018 | Ishizaki | H01L 21/32134 |
| 2020/0035485 A1 | 1/2020 | Chen et al. | |

FOREIGN PATENT DOCUMENTS

| | | |
|---|---|---|
| JP | 2005-146358 A | 6/2005 |
| JP | 2008-547202 A | 12/2008 |
| JP | 2016-527707 A | 9/2016 |
| JP | 2019-046952 A | 3/2019 |
| JP | 2020-017732 A | 1/2020 |
| TW | I638033 B | 10/2018 |
| WO | WO 2015/002272 A1 | 1/2015 |

* cited by examiner

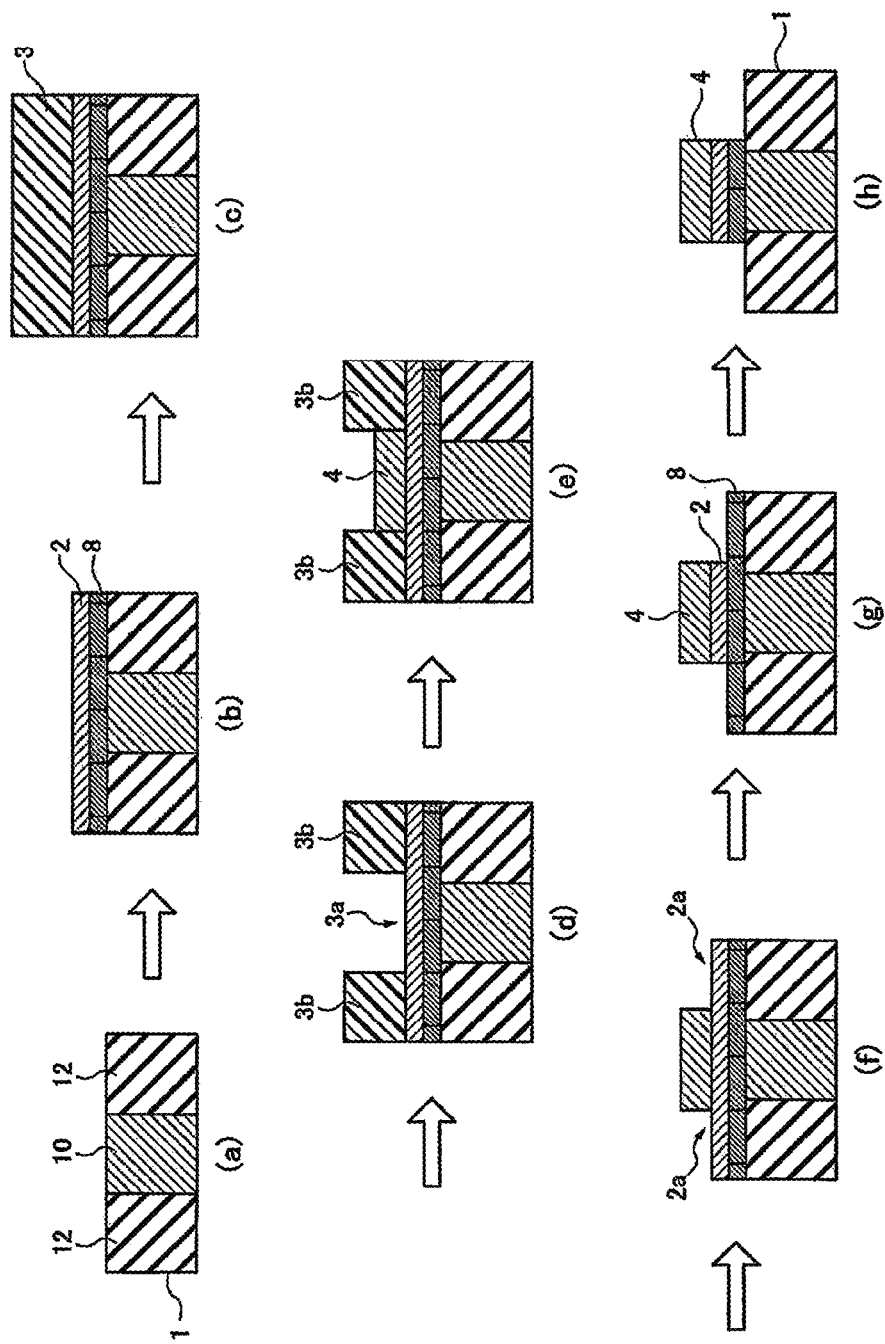

ETCHING LIQUID FOR TITANIUM AND/OR TITANIUM ALLOY, METHOD FOR ETCHING TITANIUM AND/OR TITANIUM ALLOY WITH USE OF SAID ETCHING LIQUID, AND METHOD FOR PRODUCING SUBSTRATE WITH USE OF SAID ETCHING LIQUID

CROSS-REFERENCE TO RELATED APPLICATIONS

The present application is a 35 U.S.C. § 371 National Stage Application of International Patent Application PCT/JP2021/014689, filed Apr. 7, 2021, which is based on and claims the benefit of priority to Japanese Application No. 2020-072498, filed Apr. 14, 2020. The entire contents of these applications are incorporated herein by reference.

TECHNICAL FIELD

The present invention relates to a composition for etching titanium and/or a titanium alloy. More specifically, the present invention relates to an etching composition for etching titanium and/or a titanium alloy, a method for etching titanium and/or a titanium alloy with use of the same, and a method for producing a substrate such as a printed wiring board and a semiconductor wafer with use of the etching composition.

BACKGROUND ART

Generally, a semi-additive process is used to form a fine electric circuit in a printed wiring board. For example, a metal thin film is formed on an insulating layer for use as a seed layer in electrolytic copper plating. After forming a resist pattern on the seed layer, a copper wiring is formed by electrolytic copper plating. Then, the no longer required resist pattern is removed, and the seed layer in a part having no electrolytic copper plating is removed to complete the copper wiring. Electroless copper plating or a sputtered film is selected as the seed layer, and a titanium sputtered film is increasing selected for the purpose of forming a finer wiring.

Generally, electroless copper plating used for forming a printed wiring board can be removed with an etching solution made of hydrogen peroxide and sulfuric acid. Examples of etching of a sputtered titanium film include methods described in Patent Literature 1 to 4. However, stability of hydrogen peroxide is insufficient in these methods. Therefore, practical application of an etching method capable of rapidly removing a seed layer made of titanium and/or a titanium alloy while suppressing elution of other metals of wiring such as copper or copper alloy, cobalt, etc. is urgently required.

CITATION LIST

Patent Literature

Patent Literature 1: JP H08-13166A
Patent Literature 2: JP H08-53781A
Patent Literature 3: U.S. Pat. No. 4,554,050
Patent Literature 4: JP 2005-146358A

SUMMARY OF INVENTION

Technical Problem

The present invention provides an etching composition capable of rapidly removing titanium and/or a titanium alloy, and/or titanium-containing compounds having metallic properties while suppressing elution of other metals of wiring such as copper or copper alloy, cobalt, etc., and an etching method with use of the etching composition.

Solution to Problem

As a result of diligent studies, the present inventors have found that with use of an aqueous solution containing a hydrogen peroxide, a fluoride, and a halide ion other than the fluoride ion, titanium and/or a titanium alloy, and/or titanium-containing compounds having metallic properties can be rapidly removed while suppressing elution of other metals of wiring such as copper or copper alloy, cobalt, etc., so that the present invention has been completed.

In other words, the present invention includes the following aspect.

<1>
A composition for etching titanium and/or a titanium alloy, the composition comprising a hydrogen peroxide (A), a fluoride (B), a halide ion other than the fluoride ion (C), and water (D),
wherein the content of the hydrogen peroxide (A) is 0.01 to 0.23 mass % based on a total amount of the composition,
the content of the fluoride (B) is 0.2 to 3 mass % based on the total amount of the composition, and
the content of the halide ion other than the fluoride ion (C) is 0.0005 to 0.025 mass % based on the total amount of the composition.

<2>
The composition according to item <1>, wherein the fluoride (B) comprises one or more selected from the group consisting of hydrogen fluoride, acidic ammonium fluoride, acidic sodium fluoride, and acidic potassium fluoride.

<3>
The composition according to item <1> or <2>, wherein the halide ion other than the fluoride ion (C) comprises at least one of a chloride ion and a bromide ion.

<4>
The composition according to any one of items <1> to <3>, further comprising a phosphonic acid-based chelating agent (E).

<5>
The composition according to item <4>, wherein the phosphonic acid-based chelating agent (E) comprises at least one of 1,2-propylenediaminetetra(methylenephosphonic acid) and diethylenetriaminepenta(methylenephosphonic acid).

<6>
The composition according to item <4> or <5>, wherein the content of the phosphonic acid-based chelating agent (E) is 0.005 to 0.1 mass % based on the total amount of the composition.

<7>
The composition according to any one of items <1> to <6>, being a composition for etching titanium and/or a titanium alloy while suppressing etching of copper or copper alloy.

<8>
The composition according to any one of items <1> to <7>, having an etching rate of copper of 100 nm/min or less at 30° C.

<9>
The composition according to any one of items <1> to <8>, wherein a ratio of etching rate of titanium to etching rate of copper is 2 or more at 30° C.

<10>
An etching method, comprising etching titanium and/or a titanium alloy with use of the composition according to any one of items <1> to <9>.
<11>
A method for forming an electric circuit, comprising etching titanium and/or a titanium alloy with use of the composition according to any one of items <1> to <9> to form an electric circuit in which titanium and/or a titanium alloy and copper or copper alloy are laminated.
<12>
A method for producing a substrate comprising a step of etching titanium and/or a titanium alloy with use of the composition according to any one of items <1> to <9>.

Advantageous Effects of Invention

The present invention may be effectively applied, for example, to removal of a layer composed of titanium and/or a titanium alloy and/or a titanium-containing compound having metallic properties for electrolytic plating by etching. The present invention is useful for producing electronic parts having fine wiring of copper, copper alloy, cobalt, etc., because elution of other metals of wiring such as copper or copper alloy, cobalt, etc. is suppressed.

BRIEF DESCRIPTION OF DRAWING

FIG. 1 is a diagram showing an example of step of the method for producing a printed wiring board in an embodiment of the present invention.

DESCRIPTION OF EMBODIMENTS

Hereinafter, the present invention will be specifically described. The present invention is not limited to the description of the present specification, and various changes and modifications may be made without departing from the spirit of the present invention.
1. Composition for Etching
The composition for etching titanium and/or a titanium alloy of the present invention (hereinafter, also referred to as "compositions of the present invention") comprises a hydrogen peroxide (A), a fluoride (B), a halide ion other than the fluoride ion (C), and water (D),
wherein the content of the hydrogen peroxide (A) is 0.01 to 0.23 mass % based on the total amount of the composition,
the content of the fluoride (B) is 0.2 to 3 mass % based on the total amount of the composition, and
the content of the halide ion other than the fluoride ion (C) is 0.0005 to 0.025 mass % based on the total amount of the composition.
The composition of the present invention is capable of rapidly removing titanium and/or a titanium alloy, preferably a seed layer made of titanium and/or a titanium alloy, while suppressing elution of other metals of wiring such as copper or copper alloy, cobalt, etc. More preferably, the composition of the present invention is capable of rapidly removing titanium and/or a titanium alloy, preferably a seed layer made of titanium and/or a titanium alloy, while suppressing elution of at least copper or copper alloy. In other words, the composition of the present invention is preferably a composition for etching titanium and/or a titanium alloy while suppressing etching of copper or copper alloy. The composition of the present invention may also be used to remove a layer made of a titanium-containing compound having metallic properties.

In the present specification, "copper alloy" is not particularly limited as long as it contains one or more metal elements other than copper or non-metal elements in addition to copper and has metallic properties. The content of the metal element other than copper or non-metal element in the copper alloy is not particularly limited, and the copper alloy contains copper in an amount of preferably 50 mass % or more, more preferably 80 mass % or more, still preferably 90 mass % or more, and particularly preferably 98 mass % or more. Examples of the metal elements or non-metal elements other than copper include aluminum (Al).

Further, in the present specification, "titanium alloy" is not particularly limited as long as it contains one or more metal elements other than titanium or non-metal elements in addition to titanium and has metallic properties. The content of the metal elements other than titanium or non-metal elements in the titanium alloy is not particularly limited, but the titanium alloy contains titanium in an amount of preferably 50 mass % or more, more preferably 80 mass % or more, still preferably 90 mass % or more, and particularly preferably 98 mass % or more. Examples of the metal elements other than titanium or non-metal elements include nitrogen. Examples of the nitrogen-containing titanium alloy having metallic properties include titanium nitride (TiN) and titanium nitride oxide ($TiN_xO_y$).

Further, in the present specification, "other metal" such as copper or copper alloy, cobalt, etc. means a metal other than titanium and a titanium alloy that can be used for wiring in an electric circuit, being preferably copper, copper alloy, cobalt or cobalt alloy.

In an embodiment of the present invention, the composition of the present invention may contain a phosphonic acid-based chelating agent (E) as an optional component.

Hereinafter, each component contained in the composition of the present invention will be described.
<Hydrogen Peroxide (A)>
Hydrogen peroxide (A) contained in the composition of the present invention is usually mixed with other components, as an aqueous solution having an appropriate concentration. The concentration of hydrogen peroxide (A) in the aqueous hydrogen peroxide solution used for producing the composition of the present invention is not particularly limited, and may be, for example, 10 to 90 mass %, preferably 35 to 60 mass % in accordance with industrial standard.

Further, hydrogen peroxide (A) may contain a stabilizer that is inevitably contained in the production. The production process and acquisition route of hydrogen peroxide are not limited, and for example, those produced by the anthraquinone method are used. Further, hydrogen peroxide (A) may be those purified by passing the liquid through an ion exchange resin.

The content of hydrogen peroxide (A) in the composition of the present invention may be 0.01 to 0.23 mass %, preferably 0.03 to 0.2 mass %, more preferably 0.05 to 0.15 mass %, based on the total amount of the composition. With the content of hydrogen peroxide (A) in the range, the oxidizing power for titanium and/or a titanium alloy is sufficient, so that sufficient dissolving power for titanium and/or a titanium alloy can be obtained, while suppressing elution of other metals such as copper or copper alloy, cobalt, etc. Further, with the content of hydrogen peroxide (A) of less than 0.01 mass % based on the total amount of the composition, Ti may be peeled off in a film form, so that the content of hydrogen peroxide (A) is preferably 0.01 mass % or more based on the total amount of the composition. In the case where Ti peels in a film form, the peeled Ti in a film form may reattach to a substrate in a subsequent process, and when Ti peels, Cu wiring on Ti also peels, therefore, it is preferable that Ti is not peeled off in a film form.

<Fluoride (B)>

Fluoride (B) is not particularly limited as long as it is a compound containing a fluoride ion (that is, a compound having a fluorine atom in the state of anion), and examples thereof include hydrogen fluoride (fluoric acid), lithium fluoride, sodium fluoride, potassium fluoride, rubidium fluoride, cesium fluoride, magnesium fluoride, calcium fluoride, strontium fluoride, barium fluoride, manganese fluoride, iron fluoride, copper fluoride, tin fluoride, aluminum fluoride, titanium fluoride, tantalum fluoride, antimony fluoride, ammonium fluoride, fluoroboric acid (tetrafluoroboric acid), sodium fluoroborate, potassium fluoroborate, ammonium fluoroborate, fluorosilicic acid (hexafluorosilicic acid), sodium fluorosilicate, potassium fluorosilicate, ammonium fluorosilicate, acidic sodium fluoride, acidic potassium fluoride, acidic ammonium fluoride, tetramethylammonium fluoride, and tetraethylammonium fluoride. In an embodiment of the present invention, fluoride (B) may be a fluoride among the fluorides described above that can make the liquid property to acidic when dissolved in water. In a preferred embodiment of the present invention, fluoride (B) contained in the composition of the present invention is more preferably hydrogen fluoride, fluoroboric acid, acidic sodium fluoride, acidic potassium fluoride, or acidic ammonium fluoride, and still more preferably hydrogen fluoride, acidic sodium fluoride, acidic potassium fluoride, or acidic ammonium fluoride. One type of the fluorides may be used alone, or two or more types may be used in combination.

The content of fluoride (B) in the composition of the present invention is 0.2 to 3 mass %, preferably 0.3 to 2 mass %, more preferably 0.5 to 1.8 mass %, and still more preferably 0.8 to 1.5 mass % based on the total amount of the composition. With the content of fluoride (B) in the range, sufficient dissolving power for titanium and/or a titanium alloy is obtained, so that the dissolution rate for removal of titanium and/or a titanium alloy can be controlled not be too fast.

Further, in order to remove titanium and a titanium alloy while suppressing elution of other metals such as copper or copper alloy, cobalt, etc., the ratio of [content of hydrogen peroxide (A)]/[content of fluorine derived from fluoride (B)] is preferably 0.01 to 0.5 as the mass ratio. With the mass ratio in the range, for example, the layer of titanium and/or a titanium alloy is not peeled off in a film form, or also wiring of other metal such as copper or copper alloy, cobalt, etc. on a titanium and/or a titanium alloy layer is not peeled off, and elution of other metal such as copper or copper alloy, cobalt, etc. can be prevented.

In the present invention, the liquid property of the composition for etching titanium and/or a titanium alloy can be made acidic by containing fluoride (B) described above. In an embodiment of the present invention, the pH of the composition for etching titanium and/or a titanium alloy may be preferably 3 to 6, more preferably 3.5 to 6, and still more preferably 4 to 5.5. With a pH of the composition for etching titanium and/or a titanium alloy in the range, the etching rate of copper or copper alloy, cobalt, etc. used for wiring can be favorably controlled. The pH value can be measured by a conventional method, for example, by the method described in Examples.

<Halide Ion Other than the Fluoride Ion (C)>

As a halide ion other than the fluoride ion (C), a chloride ion (Cl⁻), a bromide ion (Br⁻), and an iodide ion (I⁻) may be used. Among these, a chloride ion and a bromide ion are preferred, and a chloride ion is more preferred. In a preferred embodiment of the present invention, a halide ion other than the fluoride ion (C) may contain at least one of a chloride ion and a bromide ion.

The source of the halide ion other than the fluoride ion (C) is not particularly limited as long as it is a compound capable of supplying the halide ion other than the fluoride ion. Examples of such compounds include lithium chloride, sodium chloride, potassium chloride, ammonium chloride, lithium bromide, sodium bromide, potassium bromide, ammonium bromide, lithium iodide, sodium iodide, potassium iodide, and ammonium iodide. Among them, one or more selected from the group consisting of sodium chloride, potassium chloride, ammonium chloride, sodium bromide, potassium bromide, and ammonium bromide are preferred, and one or more selected from the group consisting of sodium chloride, potassium chloride, and ammonium chloride are especially preferred. In a preferred embodiment of the present invention, the source of the halide ion other than the fluoride ion (C) may be sodium chloride, potassium bromide, or potassium iodide.

The content of the halide ion other than the fluoride ion (C) in the composition of the present invention is 0.0005 to 0.025 mass %, preferably 0.001 to 0.01 mass %, based on the total amount of the composition. With the content of halide ion other than the fluoride ion (C) in the range, a sufficient effect of suppressing elution of copper or copper alloy and cobalt can be obtained together with favorable economic performance.

<Water (D)>

The composition of the present invention comprises water (D). Although water (D) is not particularly limited, water from which metal ions, organic impurities, particulate particles and the like are removed by distillation, ion exchange treatment, filter treatment, various adsorption treatments or the like is preferred, pure water is more preferred, and ultrapure water is especially preferred.

The content of water (D) constitutes the residue of the composition of the present invention, and is preferably 60 mass % or more, more preferably in the range of 70 to 99.7 mass %, still preferably 80 to 99.5 mass %, furthermore preferably 90 to 99.2 mass %, and especially preferably 95 to 99 mass& based on the total amount of the composition. With the content of water (D) in the range, preferred economic performance can be achieved.

<Phosphonic Acid-Based Chelating Agent (E)>

Phosphonic acid-based chelating agent (E) is not particularly limited as long as it is a compound that produces phosphonic acid-based chelate ions in an aqueous solution, and may be a salt or hydrate of phosphonic acid in addition to phosphonic acid. Examples of the salt of phosphonic acid include a sodium salt, a potassium salt, and an ammonium salt, though not limited thereto. Examples of phosphonic acid-based chelating agent (E) that may be used in the present invention include aminotri(methylenephosphonic acid), ethylenediaminetetra(methylenephosphonic acid) (EDTMP), ethylenediaminetetra(methylenephosphonic acid) hydrate, 1,2-propylenediaminetetra(methylenephosphonic acid) (PDTP), diethylenetriaminepenta(methylenephosphonic acid) (DTPP), and 1-hydroxyethane-1,1-diphosphonic acid (HEDP), though not limited thereto. In a preferred embodiment of the present invention, phosphonic acid-based chelating agent (E) may be at least one of 1,2-propylenediaminetetra(methylenephosphonic acid) (PDTP), ethylenediaminetetra(methylenephosphonic acid) (EDTMP) and a hydrate thereof, diethylenetriaminepenta (methylenephosphonic acid) (DTPP) and 1-hydroxyethane-1,1-diphosphonic acid (HEDP). In a more preferred embodiment of the present invention, phosphonic acid chelating agent (E) may be at least one of diethylenetriaminepenta (methylenephosphonic acid) (DTPP) and 1-hydroxyethan-1,1-diphosphonic acid (HEDP).

In the case where the composition of the present invention contains phosphonic acid-based chelating agent (E), the content of phosphonic acid-based chelating agent (E) may be 0.005 to 0.1 mass %, preferably 0.01 to 0.05 mass % based on the total amount of the composition. With the content of phosphonic acid-based chelating agent (E) in the range, precipitation of dissolved copper ions on titanium and/or a titanium alloy can be suppressed together with favorable economic performance.

<Other Components>

The composition of the present invention may contain other components on an as needed basis, in a range not impairing the effects of the present invention. Examples of the other components that may be contained in the composition of the present invention include a surfactant, an antifoaming agent, a hydrogen peroxide stabilizer, and a pH adjuster.

It is preferable that the composition of the present invention contain substantially no sulfuric acid. Due to containing substantially no sulfuric acid, the etching rate of copper or copper alloy, cobalt, etc. may be appropriately controlled, thereby, titanium and/or a titanium alloy, preferably a seed layer made of titanium and/or a titanium alloy, can be rapidly removed, while suppressing elution of other metals of wiring such as copper or copper alloy, cobalt, etc.

<Preparation of Composition>

The composition of the present invention may be prepared by uniformly stirring a hydrogen peroxide (A), a fluoride (B), a halide ion other than the fluoride ion (C), water (D), optionally phosphonic acid-based chelating agent (E), and other components on an as needed basis. The stirring method for the components is not particularly limited, and a commonly used stirring method may be employed.

<Use of Composition>

Although the object to be etched with use of the composition of the present invention is not particularly limited as long as it is a base material containing titanium and/or a titanium alloy to be etched, a base material to make a substrate such as a printed wiring board, a package substrate for mounting semiconductor devices, a semiconductor wafer (for example, a semiconductor substrate on which semiconductor devices are formed), or semiconductor devices (for example, semiconductor chips) is preferred. A base material to make a substrate having an electric circuit in which at least titanium and/or a titanium alloy and copper or copper alloy (electronic component) are laminated is more preferred.

A photoresist is used for forming a circuit pattern on an insulating layer having wiring of copper or copper alloy, cobalt, etc. at least in a part. The circuit pattern contains at least one selected from the group consisting of copper or copper alloy, cobalt, etc., and tin and tin alloy to make a connection terminal for the wiring of copper, copper alloy, cobalt, etc. The photoresist is removed after formation of the circuit pattern, and on an as needed basis, a copper seed layer used for forming a circuit pattern made of copper or copper alloy, cobalt, etc. is also removed. Then, the composition of the present invention can be suitably used to rapidly remove a part of the seed layer made of titanium and/or a titanium alloy exposed along with removal of the photoresist and the copper seed layer, while suppressing elution of the other metals used in the connection terminals formed of at least one selected from the group consisting of copper or copper alloy, cobalt, etc., and tin and tin alloy.

Further, the composition of the present invention can be suitably applied not only to forming of the connection terminal but also to forming of a further wiring circuit.

Here, "insulating layer having a wiring of copper or copper alloy, cobalt, etc. at least in a part" is not particularly limited as long as the insulating layer has a wiring of copper or copper alloy, cobalt, etc. embedded in the surface or inside, and examples thereof include a resin insulating layer in a printed wiring board or a package substrate for mounting semiconductor devices, and a silicon insulating layer in a semiconductor wafer or a semiconductor device.

Further, "circuit pattern containing at least one selected from the group consisting of copper or copper alloy, cobalt, tin and tin alloy to make the connection terminal of wiring of copper or copper alloy, cobalt, etc." is used as a connection terminal of the wiring of copper or copper alloy, cobalt, etc. of the insulating layer for electrical connection with another component. In an embodiment of the present invention, the connection terminal is a connection terminal of wiring of copper or copper alloy, cobalt, etc. in a printed wiring board. Further, in an embodiment of the present invention, the connection terminal is a connection terminal of wiring of copper or copper alloy, cobalt, etc. in a package substrate for mounting semiconductor devices. Further, in an embodiment of the present invention, the connection terminal is a connection terminal of wiring of copper or copper alloy, cobalt, etc. in a semiconductor wafer or a semiconductor device.

Further, in the case where a further wiring circuit is formed instead of the connection terminal, a photoresist for forming a circuit pattern containing at least one selected from the group consisting of copper or copper alloy, cobalt, etc. and tin and tin alloy, to make a wiring circuit connected to the wiring of copper or copper alloy, cobalt, etc. on an insulating layer having wiring of copper or copper alloy, cobalt, etc. at least in a part is removed after forming of the circuit pattern. On an as needed basis, a copper seed layer used for forming a circuit pattern of copper or copper alloy, cobalt, etc. is further removed. Then, while suppressing elution of other metals used in the wiring circuit formed of at least one selected from the group consisting of copper or copper alloy, cobalt, etc. and tine and tin alloy, a part of the seed layer made of titanium and/or a titanium alloy exposed along with removal of the photoresist and the copper seed layer is rapidly removed, so that a wiring circuit connected with the wiring of copper or copper alloy, cobalt, etc. can be formed on an insulating layer having the wiring of copper or copper alloy, cobalt, etc. at least in a part. In an embodiment of the present invention, the wiring circuit is an electric circuit formed on an insulating layer having a wiring of copper or copper alloy, cobalt, etc. of a printed wiring board and a package substrate for mounting semiconductor device at least in a part. Further in an embodiment of the present invention, the wiring circuit is an electric circuit formed on an insulating layer having a wiring of copper or copper alloy, cobalt, etc. of a semiconductor wafer and a semiconductor device at least in a part.

In a production step of a printed wiring board (for example, package substrate for mounting semiconductor devices), a photoresist for forming a connection terminal of the wiring of copper or copper alloy, cobalt, etc. and a circuit pattern containing at least one selected form the group consisting of copper or copper alloy, cobalt, etc. and tin and tin alloy to make a wiring circuit on an insulating layer having a wiring of copper or copper alloy, cobalt, etc. at least in a part is removed after forming of the circuit pattern. On an as needed basis, a copper seed layer used for forming the circuit pattern of copper or copper alloy, cobalt, etc. is further removed. Then, the composition of the present invention is suitably used to rapidly remove a part of the seed layer made of titanium and/or a titanium alloy exposed along with removal of the photoresist and the copper seed layer, while suppressing elution of other metals used for wiring of copper or copper alloy, cobalt, etc.

Further, in a production step of a semiconductor wafer and a semiconductor device, a photoresist for forming a circuit pattern containing at least one selected from the group consisting of copper, tin and tin alloy to make a connection terminal and wiring circuit of the wiring of copper or copper alloy, cobalt, etc. on an insulating layer having a wiring of copper or copper alloy, cobalt, etc. at least in a part is removed after forming of the circuit pattern. On an as needed basis, a copper seed layer used for forming the circuit pattern of copper or copper alloy, cobalt, etc. is further removed. Then, the composition of the present invention is suitably used to rapidly remove a part of the seed layer made of titanium and/or a titanium alloy exposed along with removal of the photoresist and the copper seed layer, while suppressing elution of other metals used for such as wiring of copper or copper alloy, cobalt, etc.

Examples of the photoresist used in production of a printed wiring board include a composition containing a binder polymer, a photopolymerizable monomer, a photopolymerization initiator, and other additives.

Examples of the binder polymer include those obtained by copolymerizing several types of vinyl monomers such as methacrylic acid ester, acrylic acid ester, and styrene with at least one of methacrylic acid and acrylic acid as essential component.

Preferred examples of the photopolymerizable monomer include at least one of a methacrylic acid ester and an acrylic acid ester.

Examples of the photopolymerization initiator include at least one selected from the group consisting of benzophenone, 4,4'-diaminobenzophenone, 4,4'-bis(dimethylamino) benzophenone, 2-ethylanthraquinone, benzoin, benzoin methyl ether, 9-phenylacridine, benzyl dimethyl ketal, and benzyl diethyl ketal. Alternatively, a bimolecular system including hexaarylbiimidazole and a hydrogen donor (2-mercaptobenzoxazole, N-phenylglycine) may be used.

Examples of the other additives include thermal polymerization initiators and dyes.

Preferred examples of the photoresist used for producing semiconductor wafers and semiconductor devices include a combination of a phenol-formaldehyde resin (collectively referred to as "novolac resin") and a naphthoquinone diazide compound as photosensitive component.

2. Etching Method

The etching method of the present invention is a method for etching titanium and/or a titanium alloy including contacting the object with the composition of the present invention. According to the etching method with use of the composition of the present invention, for example, a seed layer made of titanium and/or a titanium alloy can be rapidly removed, while suppressing elution of other metals of wiring such as copper or copper alloy, cobalt, etc.

In the etching method of the present invention, the temperature of the etching treatment with use of the composition of the present invention is not particularly limited, preferably 10 to 70° C., more preferably 20 to 65° C., still preferably 25 to 60° C., and particularly preferably 20 to 50° C. With a temperature of the etching treatment in the range, etching conditions can be kept constant while suppressing the composition change of the composition of the present invention, so that the removability of titanium and a titanium alloy to be etched can be improved, as a result, the production efficiency of substrates such as printed wiring boards tends to be excellent. Further, within the range, elution of other metals such as copper or copper alloy, cobalt, etc. also tends to capable of being suppressed. Although the etching rate of titanium and a titanium alloy increases with increase in the temperature of the etching treatment, the optimum temperature may be appropriately determined in consideration of suppressing the composition change of the composition to be small.

In the etching method of the present invention, the etching treatment time with use of the composition of the present invention is not particularly limited, preferably 20 seconds to 600 seconds, more preferably 30 seconds to 300 seconds, and may be 30 seconds to 240 seconds. The etching treatment time may be appropriately determined in consideration of various conditions such as the surface conditions of titanium and/or a titanium alloy to be etched, the concentration of the composition, and the temperature of the etching treatment.

In the etching method of the present invention, the method for contacting the composition of the present invention with titanium and/or a titanium alloy to be etched is not particularly limited. For example, a method of contacting the composition of the present invention with titanium and/or a titanium alloy to be etched in the form of dropping (single wafer spinning) or spraying (atomizing), or a method of immersing a base material containing titanium and/or a titanium alloy to be etched in the composition of the present invention may be employed. In the present invention, any one of the methods may be employed.

In the etching method of the present invention, a certain amount of liquid is drawn out from the bath of the composition of the present invention so as to keep the concentration of the dissolved metal constant, and a deficient component is replenished to allow to perform a continuous and stable etching process. In the etching method of the present invention, the concentration of the metal in the composition of the present invention is preferably 0.5 mass % or less, more preferably 0.1 mass % or less. In the etching method of the present invention, with a metal concentration in the range, the amount drawn out for maintaining the metal concentration is not excessively increased, which is economical, and the etching rate is not excessively reduced, so that the production efficiency of a substrate can be appropriately maintained.

In the etching method of the present invention, a stabilizer of hydrogen peroxide may be added or replenished in order to suppress the decomposition of hydrogen peroxide for maintaining the etching effect.

In an embodiment of the present invention, the etching rate of copper or copper alloy, cobalt, etc. at 30° C. is preferably 100 nm/min or less. With an etching rate of copper or copper alloy and cobalt at 30° C. in the range, elution of other metals of wiring of copper or copper alloy, cobalt, etc. can be suppressed to appropriately maintain the production efficiency of a substrate. In an embodiment of the present invention, the etching rate of copper or copper alloy, cobalt at 30° C. may be preferably 70 nm/min or less, more preferably 50 nm/min or less, and still preferably 30 nm/min or less. The etching rate of copper or copper alloy, cobalt, etc. at 30° C. can be measured by the method described in Examples.

In an embodiment of the present invention, the etching rate of titanium at 30° C. is preferably 100 nm/min or more. With an etching rate of titanium at 30° C. in the range, a layer made of titanium and/or a titanium alloy can be rapidly removed. In an embodiment of the present invention, the etching rate of titanium at 30° C. may be more preferably 150 nm/min or more, still preferably 200 nm/min or more. With an etching rate of titanium at 30° C. of 1000 nm/min or more, the conveyor transfer rate is not attainable, the etching rate is therefore preferably less than 1000 nm/min. The etching rate of titanium at 30° C. can be measured by the method described in Examples.

In an embodiment of the present invention, the ratio of the etching rate of titanium to the etching rate of copper at 30° C. is preferably 2 or more and 50 or less. With a ratio of the etching rate of titanium to the etching rate of copper at 30° C. in the range, a layer made of titanium and/or a titanium alloy can be rapidly removed while suppressing the elution of other metals such as wiring of copper or copper alloy, cobalt, etc. In an embodiment of the present invention, the ratio of the etching rate of titanium to the etching rate of copper at 30° C. may be more preferably 2.5 or more and 30 or less, and still preferably 3 or more and 10 or less. The ratio of the etching rate of titanium to the etching rate of copper at 30° C. can be measured by the method described in Examples.

3. Method for Forming Electric Circuit

The method for forming an electric circuit of the present invention is a method for forming an electric circuit in which titanium and/or a titanium alloy and copper or copper alloy, cobalt, etc. are laminated, with use of method for etching titanium and/or a titanium alloy including contacting the object with the composition of the present invention with use of the above composition of the present invention. By etching with use of the composition of the present invention, a seed layer made of titanium and/or a titanium alloy can be rapidly removed, while suppressing elution of other metals of wiring such as copper or copper alloy, cobalt, etc. Thereby, on an insulating layer having wiring of copper or copper alloy, cobalt, etc. at least in a part, a circuit pattern containing at least one selected from the group consisting of copper, tin and tin alloy to make the connection terminal and wiring circuit of wiring of copper or copper alloy, cobalt, etc. can be formed with a good yield. The circuit pattern thus formed makes an electric circuit. The method for forming an electric circuit of the present invention preferably includes etching titanium and/or a titanium alloy to form an electric circuit in which at least titanium and/or a titanium alloy and copper or copper alloy are laminated.

4. Method for Producing Substrate

In the method for producing a substrate of the present invention includes a step of contacting the object with the composition of the present invention for etching titanium and/or a titanium alloy. By etching with use of the composition of the present invention, a seed layer made of titanium and/or a titanium alloy can be rapidly removed, while suppressing elution of other metals of wiring of copper or copper alloy, cobalt etc. Thereby, on an insulating layer having wiring of copper or copper alloy, cobalt, etc. at least in a part, a substrate having a circuit pattern including at least one selected from the group consisting of copper or copper alloy, cobalt, tin or tin alloy to make the connection terminal of the wiring of copper or copper alloy, cobalt, etc. can be formed with a good yield. In the present specification, examples of the substrate include a printed wiring board, a package substrate for mounting semiconductor devices, a semiconductor wafer, and a semiconductor device, though not limited thereto.

The substrate obtained by the method for producing a substrate of the present invention is preferably a substrate having an electric circuit in which at least titanium and/or a titanium alloy and copper and/or copper alloy are laminated.

As an example of the method for producing a substrate, an example of the method for producing a printed wiring board will be described below. FIG. 1 is a diagram showing an example of step of the method for producing a printed wiring board in an embodiment of the present invention.

As shown in FIG. 1 (*a*), first, a resin substrate 1 which is an insulating layer having a copper wiring 10 in a part is prepared, wherein the copper wiring 10 is embedded between interlayer insulating resins 12.

Subsequently, as shown in FIG. 1 (*b*), a titanium/a titanium alloy layer 8 is formed as barrier metal layer on a surface of the resin substrate 1, and a copper layer 2 is formed on the surface of the titanium/a titanium alloy layer 8. The copper layer 2 may be formed by subjecting the surface of the titanium/a titanium alloy layer 8 to chemical copper plating, or may be formed by sputtering a copper film. In the method for producing a printed wiring board of the present invention, it is preferable to form the copper layer 2 by sputtering a copper film. Although not shown in drawing, another layer may be further formed between the copper layer 2 and the titanium/a titanium alloy layer 8 (barrier metal layer). The barrier metal layer such as a titanium layer may be formed by for example, sputtering a film.

Subsequently, as shown in FIG. 1 (*c*), a dry film resist layer 3 is formed on a surface of the copper layer 2, and a circuit mask pattern not shown in drawing is applied thereto, and through exposure and development, as shown in FIG. 2 (*d*), a resist pattern made of a photoresist 3*b* having an opening 3*a* through which a part of the surface of the copper layer 2 is exposed is formed.

Subsequently, as shown in FIG. 1 (*e*), the opening 3*a* of the resist pattern is electrolytically copper-plated to form a copper layer (copper plating) 4. Further, though not shown in drawing, a surface of the copper layer 4 may be tin plated or tin alloy-plated (for example, tin-silver alloy plating) to form a tin layer or a tin alloy layer, so that a circuit pattern containing at least one selected from the group consisting of copper, tin and tin alloy to make a connection terminal of the copper wiring 10 is formed. Alternatively, though not shown in drawing, a surface of the copper layer 4 may be sequentially tin-plated and tin alloy-plated to form a tin layer and a tin alloy layer, so that a circuit pattern including copper, tin and tin alloy to make the connection terminal of the copper wiring 10 is formed. On this occasion, the sequence of tin plating and tin alloy plating is not particularly limited and may be appropriately determined.

After forming the circuit pattern, the photoresist 3*b* is contacted with a photoresist removing composition to remove the photoresist 3*b* as shown in FIG. 2 (*f*).

Subsequently, by contacting a copper etching composition with the exposed part 2*a* of the copper layer 2, the exposed part 2*a* of the copper layer 2 is removed as shown in FIG. 1 (*g*).

Then, with use of the composition of the present invention, the titanium/a titanium alloy layer 8 (barrier metal layer) exposed by removing the exposed part 2*a* is removed, and as shown in FIG. 1 (*h*), a connection terminal of the copper wiring 10 can be formed on the resin substrate 1.

As described above, a printed wiring board having a circuit pattern containing at least one selected from the group consisting of copper, tin and tin alloy to make a copper wiring and a connection terminal of the copper wiring can be produced. The connection terminal can be used when mounting semiconductor devices on the resulting printed wiring board (package substrate for mounting semiconductor devices).

In the case where the substrate is a semiconductor wafer, the semiconductor wafer having a connection terminal of the copper wiring 10 formed on a silicon substrate 1 can be produced in the same manner as in an example of the step in the method for producing a printed wiring board illustrated above, except that the interlayer insulating resin 12 is replaced with a silicon insulating layer 12, and the resin substrate 1 is replaced with a silicon substrate 1. Then, the semiconductor wafer can be cut into predetermined sizes for use as a semiconductor device.

In such a way, a semiconductor device having a circuit pattern containing at least one selected from the group consisting of copper, tin and tin alloy to make a copper wiring and a connection terminal of the copper wiring can be produced. The connection terminal can be used when the resulting semiconductor devices are mounted on such as a printed wiring board (package substrate for mounting the semiconductor devices).

EXAMPLES

Although the present invention will be specifically described with reference to Examples as follows, the embodiments may be appropriately changed as long as the effects of the present invention are exhibited.

<Preparation of Substrate>

A titanium film having a thickness of 500 nm was formed on a glass substrate having a thickness of 1 mm by sputtering to obtain a titanium film sample for measuring the etching rate.

A copper film having a thickness of 20 μm was formed by electrolytic copper plating on both sides of a copper foil clad laminate with a 12-μm copper foil on both sides (HL-832HS manufactured by Mitsubishi Gas Chemical Company, Inc.) to obtain a copper film sample for measuring the etching rate.

<Preparation of Chemical Solution>

Into a resin beaker having a capacity of 100 mL, as shown in Table 1, component (A), component (B), component (C), component (D) and, on an as needed basis, other optional components were fed and stirred to prepare a uniform aqueous composition.

<Measurement of Etching Rate>

Etching was performed by immersing a substrate sample in an aqueous composition at 30° C. and stirred with a stirrer (300 rpm) to contact the substrate sample with the aqueous composition. In measurement of the etching rate, first, the etching rate of copper was measured, and then the etching rate of titanium was measured with use of the aqueous composition used for measuring the etching rate of copper.

In measurement of the etching rate of copper, the mass of a copper film sample was measured before and after the treatment, and the etched thickness was calculated from the mass difference, the copper density (8.92 g/cm$^3$), and the copper film area of the copper film sample to determine the amount etched per minute (etching rate of copper).

In measurement of the etching rate of titanium, a titanium film sample was contacted with an aqueous composition, and the time required for visually checking disappearance of titanium on the glass substrate was recorded, further, with use of SEM-EDX (S-3700 manufactured by Hitachi High Technologies Corporation/INCA x-act manufactured by Oxford), absence of titanium on the glass substrate after etching was checked, and then, from the visually checked required time, the amount etched per minute (etching rate of titanium) was determined.

<Measurement of Copper Precipitate on Titanium>

After measuring the etching rate of copper, the etching rate of titanium was measured. When measuring the etching rate of titanium, the surface of titanium was visually observed first, and the presence or absence of copper precipitate was checked based on whether or not the color turned brown. Furthermore, with use of SEM-EDX (S-3700 manufactured by Hitachi High-Technologies Corporation/INCA x-act manufactured by Oxford), the presence or absence of copper precipitation was checked again. In the case where copper precipitate was identified when the measurement of the etching rate of titanium, measurement of the etching rate of titanium was performed with use of another newly prepared etching solution without measuring the etching rate of copper.

<Measurement of pH Value>

The pH value of the compositions in Examples and Comparative Examples was measured at 25° C. using a pH meter (pH meter F-52 manufactured by HORIBA, Ltd.). The pH value was measured before measuring the etching rate.

The results are shown in Table 1.

TABLE 1

| | Hydrogen peroxide (A) H2O2 mass % | Fluoride (B) NH4HF2 mass % | Halide ion (C) Cl— mass % | Phosphonic acid-based chelating agent (E) PDTP mass % | Water (D) Water (residue) mass % | pH | Cu E.R. (nm/min) | TI E.R. (nm/min) | E.R. ratio (-) | Remarks |
|---|---|---|---|---|---|---|---|---|---|---|
| Example 1 | 0.0125 | 1.0 | 0.0025 | 0.000 | 98.9850 | 4.7 | 6 | 250 | 40.1 | Cu precipitation on Ti |
| Example 2 | 0.0400 | 1.0 | 0.0025 | 0.000 | 98.9575 | 4.7 | 17 | 231 | 13.9 | Cu precipitation on Ti |
| Example 3 | 0.100 | 1.0 | 0.0025 | 0.000 | 98.8975 | 4.7 | 42 | 188 | 4.5 | Cu precipitation on Ti |
| Example 4 | 0.100 | 1.0 | 0.0025 | 0.010 | 98.8875 | 4.7 | 27 | 111 | 4.1 | |
| Example 5 | 0.100 | 1.0 | 0.0025 | 0.100 | 98.7975 | 4.7 | 23 | 142 | 6.2 | |
| Example 6 | 0.100 | 1.0 | 0.0025 | DTPP: 0.025 | 98.8725 | 4.7 | 8 | 250 | 31.3 | |
| Example 7 | 0.100 | 1.0 | 0.0025 | HEDP: 0.015 | 98.8825 | 4.7 | 14 | 280 | 20.0 | |
| Example 8 | 0.100 | 1.0 | 0.0025 | EDTMP: 0.025 | 98.8725 | 4.7 | 70 | 279 | 4.0 | |
| Example 9 | 0.200 | 1.0 | 0.0025 | 0.000 | 98.7975 | 4.7 | 64 | 167 | 2.6 | Cu precipitation on Ti |
| Example 10 | 0.100 | 0.5 | 0.0025 | 0.025 | 99.3725 | 4.6 | 12 | 100 | 8.1 | |

TABLE 1-continued

Table 1

| | Hydrogen peroxide (A) H2O2 mass % | Fluoride (B) NH4HF2 mass % | Halide ion (C) Cl— mass % | Phosphonic acid-based chelating agent (E) PDTP mass % | Water (D) Water (residue) mass % | pH | Cu E.R. (nm/min) | TI E.R. (nm/min) | E.R. ratio (−) | Remarks |
|---|---|---|---|---|---|---|---|---|---|---|
| Example 11 | 0.100 | 1.0 | 0.0025 | 0.025 | 98.8725 | 4.7 | 29 | 222 | 7.6 | |
| Example 12 | 0.100 | 1.25 | 0.0025 | 0.025 | 98.6225 | 4.7 | 23 | 333 | 4.6 | |
| Example 13 | 0.100 | 2.0 | 0.0025 | 0.025 | 97.8725 | 4.7 | 17 | 600 | 36.1 | |
| Example 14 | 0.100 | 3.0 | 0.0025 | 0.025 | 96.8725 | 4.7 | 27 | 833 | 30.9 | |
| Example 15 | 0.100 | 1.0 | 0.0010 | 0.025 | 98.8740 | 4.7 | 31 | 250 | 8.0 | |
| Example 16 | 0.100 | 1.0 | 0.0100 | 0.025 | 98.8650 | 4.7 | 25 | 222 | 8.9 | |
| Example 17 | 0.100 | 1.0 | 0.0200 | 0.025 | 98.8550 | 4.7 | 37 | 231 | 6.2 | |
| Example 18 | 0.100 | 1.0 | Br—: 0.0025 | 0.025 | 98.8725 | 4.7 | 31 | 261 | 8.4 | |
| Example 19 | 0.100 | 1.0 | Br—: 0.01 | 0.025 | 98.8650 | 4.7 | 31 | 252 | 8.1 | |
| Example 20 | 0.100 | 1.0 | I—: 0.0025 | 0.025 | 98.8725 | 4.7 | 50 | 270 | 5.4 | |
| Example 21 | 0.100 | 1.0 | I—: 0.01 | 0.025 | 98.8650 | 4.7 | <1 | 256 | >256 | |

As halide ion (C) source, sodium chloride was used as chloride ion (Cl⁻) source, potassium bromide was used as bromide ion (Br⁻) source, and potassium iodide was used as iodide ion (I⁻) source.

PDTP: 1,2-propylenediaminetetra(methylenephosphonic acid)
DTPP: diethylenetriaminepenta(methylenephosphonic acid)
HEDP: 1-hydroxyethane-1,1-diphosphonic acid
EDTMP: ethylenediaminetetra(methylenephosphonic acid)

In the table, $H_2O_2$ represents hydrogen peroxide and $NH_4HF_2$ represents acidic ammonium fluoride.

TABLE 2

Table 2

| | Hydrogen peroxide (A) H2O2 mass % | Fluoride (B) NH4HF2 mass % | Halide ion (C) Cl— mass % | Phosphonic acid-based chelating agent (E) PDTP mass % | Water (D) Water (Residue) mass % | pH | Cu E.R. (nm/min) | TI E.R. (nm/min) | E.R. ratio (−) | Remarks |
|---|---|---|---|---|---|---|---|---|---|---|
| Comparative Example 1 | 0.000 | 1.0 | 0.0000 | 0.000 | 99.0000 | 4.7 | 6 | 207 | 33.2 | Peeling of Ti in film form |
| Comparative Example 2 | 0.000 | 1.0 | 0.0025 | 0.000 | 98.9975 | 4.7 | 4 | 268 | 64.5 | Peeling of Ti in film form |
| Comparative Example 3 | 0.250 | 1.0 | 0.0025 | 0.000 | 98.7475 | 4.7 | 116 | 172 | 1.5 | |
| Comparative Example 4 | 0.200 | 1.0 | 0.0000 | 0.000 | 98.8000 | 4.7 | 756 | 166 | 0.2 | |
| Comparative Example 5 | 0.100 | 0.1 | 0.0025 | 0.025 | 99.7725 | 4.3 | 29 | 22 | 0.8 | |

As halide ion (C) source, sodium chloride was used as chloride ion (Cl⁻) source.

PDTP: 1,2-propylenediaminetetra(methylenephosphonic acid)

In the table, $H_2O_2$ represents hydrogen peroxide and $NH_4HF_2$ represents acidic ammonium fluoride.

As shown above, by etching with use of the composition of the present invention, a seed layer made of titanium and/or a titanium alloy can be rapidly removed, while suppressing elution of other metals of wiring such as copper or copper alloy, cobalt, etc.

REFERENCE SIGNS LIST

1: RESIN SUBSTRATE or SILICON SUBSTRATE
2: COPPER LAYER
2a: EXPOSED PART
3: DRY FILM RESIST
3a: OPENING
3b: PHOTORESIST
4: COPPER LAYER (COPPER PLATING)
8: TITANIUM/TITANIUM ALLOY LAYER (BARRIER METAL LAYER)
10: COPPER WIRING
12: INTERLAYER INSULATING RESIN or SILICON INSULATING LAYER

The invention claimed is:
1. A composition for etching titanium and/or a titanium alloy, wherein the composition consists essentially of a hydrogen peroxide (A), a fluoride (B), a halide ion (C) other than the fluoride ion which is contained in the fluoride (B), and water (D),
wherein a content of the hydrogen peroxide (A) is from 0.01 to 0.23 mass % based on a total amount of the composition,
a content of the fluoride (B) is from 0.2 to 3 mass % based on the total amount of the composition, and a content of the halide ion (C) is from 0.0005 to 0.025 mass % based on the total amount of the composition, wherein the source of the halide ion (C) is at least one selected from the group consisting of lithium chloride, sodium chloride, potassium chloride, ammonium chloride, lithium bromide, sodium bromide, potassium bromide, ammonium bromide, lithium iodide, sodium iodide, potassium iodide, and ammonium iodide.

2. The composition according to claim 1, wherein the fluoride (B) comprises at least one selected from the group consisting of hydrogen fluoride, acidic ammonium fluoride, acidic sodium fluoride, and acidic potassium fluoride.

3. The composition according to claim 1, wherein the halide ion (C) comprises at least one selected from the group consisting of a chloride ion and a bromide ion.

4. The composition according to claim 1, being a composition for etching titanium and/or a titanium alloy while suppressing etching of copper or a copper alloy.

5. The composition according to claim 1, having an etching rate of copper of 100 nm/min or less at 30° C.

6. The composition according to claim 1, wherein a ratio of an etching rate of titanium to an etching rate of copper is at least 2 at 30° C.

7. An etching method, comprising etching titanium and/or a titanium alloy with the composition according to claim 1.

8. A method for forming an electric circuit, comprising etching titanium and/or a titanium alloy with the composition according to claim 1 to form an electric circuit in which titanium and/or a titanium alloy and copper or a copper alloy are laminated.

9. A method for producing a substrate, comprising etching titanium and/or a titanium alloy with the composition according to claim 1.

* * * * *